United States Patent [19]

Miyazaki et al.

[11] Patent Number: 5,212,361

[45] Date of Patent: May 18, 1993

[54] METHOD AND APPARATUS FOR FORMING BALLS AT THE ENDS OF WIRES

[75] Inventors: Naoki Miyazaki; Kazuhiro Kawabata, both of Fukuoka, Japan

[73] Assignee: Mitsubishi Denki Kabushiki Kaisha, Tokyo, Japan

[21] Appl. No.: 797,343

[22] Filed: Nov. 25, 1991

Related U.S. Application Data

[63] Continuation-in-part of Ser. No. 623,254, Dec. 5, 1990, abandoned, which is a continuation-in-part of Ser. No. 460,535, Jan. 3, 1990, abandoned.

[30] Foreign Application Priority Data

Jan. 7, 1989 [JP] Japan .................................... 1-1618

[51] Int. Cl.$^5$ ................................................ B23K 9/00
[52] U.S. Cl. .............................. 219/56.22; 219/130.33
[58] Field of Search .............. 219/56.21, 56.22, 130.33

[56] References Cited

U.S. PATENT DOCUMENTS

| | | | |
|---|---|---|---|
| 4,390,771 | 6/1983 | Kurtz et al. | 219/56.22 |
| 4,482,794 | 11/1984 | Kurts et al. | 219/56.21 |
| 4,687,897 | 8/1987 | McKeil, Jr. | 219/56.21 |
| 4,866,247 | 9/1989 | Parks et al. | 219/130.21 |

*Primary Examiner*—Clifford C. Shaw
*Attorney, Agent, or Firm*—Leydig, Voit & Mayer

[57] ABSTRACT

A method of forming a ball on the end of a wire by electrical discharge between the wire and an electrode includes detecting the discharge voltage and discharge current of an electrical discharge between an end of a wire having a diameter and an electrode; multiplying the discharge voltage by the discharge current for respective time intervals during the discharge to compute the heat energy supplied in the discharge during each time interval; integrating the heat energy for the time intervals during a discharge to determine the total heat energy supplied during the discharge; comparing the total heat energy with a predetermined heat energy that produces a ball on the end of the wire, the ball having a diameter of about two to three and one-half times the diameter of the wire; and controlling at least one of the discharge voltage, current, and duration in accordance with the comparison and terminating the discharge when the total heat energy supplied to the discharge exceeds the predetermined heat energy.

17 Claims, 10 Drawing Sheets (a) START SIGNAL FROM DRIVE CIRCUIT 9

(b) OUTPUT VOLTAGE FROM DISCHARGE CIRCUIT 6

(c) OPERATION SIGNAL FROM DISCHARGE TIME SETTING CIRCUIT 8

(d) DISCHARGE CURRENT Is FROM DISCHARGE CURRENT SUPPLY CIRCUIT (e) GAP VOLTAGE DETECTED BY GAP VOLTAGE DETECTION CIRCUIT (f) REFERENCE VOLTAGE (Vo)

(g) HIGH GAP VOLTAGE (h) LOW GAP VOLTAGE

METHOD AND APPARATUS FOR FORMING BALLS AT THE ENDS OF WIRES

This disclosure is a continuation-in-part of U.S. patent application Ser. No. 07/623,254, filed Dec. 5, 1990, now abandoned, which is a continuation-in-part of U.S. patent application no. 07/460,535, filed Jan. 3, 1990, now abandoned.

FIELD OF THE INVENTION

The present invention relates to a method and apparatus for forming balls at the ends of wires for use in wire bonding of semiconductor devices.

BACKGROUND ART

FIG. 1 is a schematic block diagram of a wire bonding apparatus disclosed in Japanese Published patent application no. 57-39055. In this apparatus, a wire 1 coiled on a wire spool 5 is fed through a clamp 4 and a capillary 2. A ball 1a is formed at the end of the wire 1 projecting out of the capillary 2 in an arc discharge. The arc is formed between the end of the wire protruding from the capillary 2 and an electrode 3. A high voltage is applied between the electrode 3 and the wire 1 which are intended to be separated by an air space. A resistance Rg represents the resistance of the air gap. A discharge voltage circuit 6 applies a voltage of at least 2,200 volts between the electrode 3 and the end of the wire, producing a discharge that melts the end of the wire. The molten metal of the wire forms a sphere or a ball 1a because of the surface tension of the molten metal. A discharge current supply circuit 7 supplies a constant discharge current between the electrode 3 and the wire 1, once an arc is established, for a time period determined by a discharge time setting circuit 8.

In order to form a ball at the end of the wire 1, a start signal is supplied externally and, in response, a drive circuit 9 delivers a start signal both to the discharge voltage circuit and the discharge time setting circuit 8. A gap voltage detection circuit 10 detects the voltage across the gap between the electrode 3 and the wire 1 and a voltage determining circuit 11 determines whether the voltage across the gap exceeds or is less than a preestablished reference voltage. An output means 12 produces a signal in response to the determination by the voltage determining circuit 11 of the relative magnitude of the gap voltage. The output signal corresponding to this comparison is supplied to a display (not shown) for displaying information on whether the discharge is being conducted properly.

The time sequence of operation of the apparatus of FIG. 1 is illustrated in FIGS. 2(a)-2(h). At time $t_1$, the drive circuit 9 delivers a start signal to the discharge voltage circuit 6 and to the discharge time setting circuit 8, as shown in FIG. 2(a). The discharge voltage circuit 6 supplies a voltage of at least 2,200 volts for a period of about one millisecond, as illustrated in FIG. 2(b), to initiate a discharge between the wire 1 and the electrode 3. In response to the start signal, the discharge time setting circuit 8 supplies an operational signal to the discharge current supply circuit 7 from time $t_1$ to $t_2$, as shown in FIG. 2(c). During that time period, the discharge current supply circuit 7 supplies a constant discharge current $I_s$, as shown in FIG. 2(d). The continued flow of the discharge current during this time period results in the melting of the end of the wire 1 and the formation of the ball 1a. At the same time, the voltage across the gap between the wire 1 and the electrode 3 is monitored by the gap voltage detection circuit 10 which, during proper operation, has the waveform shown in FIG. 2(e). After a predetermined time delay between the times $t_2$ and $t_3$ when the discharge initiating voltage is applied across the gap, a sustaining voltage is applied across the gap. The sustaining voltage is supplied to the voltage determining circuit 11 where a comparison is made between the voltage across the gap and a reference voltage $V_0$, as shown in FIG. 2(f). The voltage maintained across the gap may be larger or smaller than the reference voltage, as illustrated in FIGS. 2(g) and 2(h), respectively. The result of this comparison is supplied to a display section (not shown) to indicate whether the discharge is being properly carried out.

In the course of forming a ball 1a, as illustrated in FIG. 3, the heat energy HB in calories required to form the ball can be calculated from the formula:

$$HB = Rg(Is)^2 t_s/4.185 = Vg\ Is\ t_s/4.185$$

where Rg is the gap resistance, Vg is the gap voltage, Is is the discharge current, and $t_s$ represents the discharge time. When the heat energy required to form a particular ball is known, interrelated values of Vg, Is, and $t_s$ can be determined.

In the idealized operation of the prior art apparatus described above, the gap voltage Vg, the discharge current Is, and the discharge time $t_s$ are all constant. However, in operation, as illustrated in FIG. 4, the apparatus does not always operate as intended. In the desired operation, the wire 1 is extended by a length $l_1$ from the capillary 2, leaving a gap of length $l_2$ between the tip of the wire and the electrode 3. However, when the length $l_1$ of the wire varies, the discharge distance, i.e., the gap of length $l_2$, varies, altering the gap resistance and the voltage required to initiate a discharge. Likewise, the total heat energy supplied to the wire in the discharge with controlled parameters can change, making it extremely difficult to repeatedly form balls at the end of the wire that are uniform in size. Size uniformity of the balls is extremely important in the manufacture of semiconductor devices where the balls are used to make ball bonds to electrodes of semiconductor devices. As the density of leads extending from semiconductor devices has increased in recent years, the space available for each ball bond has been reduced. The reduced spacing has increased the criticality of reliably and repeatedly forming balls of essentially uniform size.

Ball size non-uniformities can be caused by mechanical variations in the operation of the bonding apparatus. For example, when the wire 1 is not advanced through the clamp 4, no discharge can be sustained, even if the discharge can be initiated between the capillary 2 and the electrode 3. On the other hand, when the wire 1 is advanced too far through the capillary tube, it may actually touch the electrode 3 so that a discharge cannot be formed between the wire 1 and the electrode 3 and no ball can be formed on the end of the wire. Even when the wire is advanced as desired, as illustrated in FIG. 4, vibrations may be present that can significantly alter the relatively small gap that is present between the wire 1 and the electrode 3. These variations in the gap length $l_2$ interfere with the formation of balls of uniform size.

SUMMARY OF THE INVENTION

It is an object of the present invention to provide a method and apparatus for reliably forming balls of uniform and controlled size at the ends of wires.

It is a further object of the invention to provide a method and apparatus for reliably forming balls at the ends of wires, the balls having diameters ranging from about 2.0 to about 3.5 times the diameter of the wire.

According to one aspect of the invention, a method for forming a ball at the end of a wire with an electrical discharge includes detecting the discharge voltage and discharge current of an electrical discharge between an end of a wire having a diameter and an electrode, multiplying the discharge voltage by the discharge current for respective time intervals during the discharge to compute the heat energy supplied to the discharge during each time interval, integrating the heat energies of the time intervals during a discharge to determine the total heat energy supplied to the discharge, comparing the total heat energy supplied with a predetermined heat energy that produces a ball on the end of a wire having a diameter of about two to three and one-half times the diameter of the wire, and controlling at least one of the discharge voltage, the discharge current, and duration of the discharge in accordance with the comparison and terminating the discharge when the total heat energy reaches the predetermined heat energy.

In accordance with another aspect of the invention, an apparatus for forming a ball at the end of a wire by an electrical discharge between the wire and an electrode includes detecting means for detecting discharge voltage and discharge current of an electrical discharge between an end of a wire having a diameter and an electrode, multiplying means for multiplying the discharge voltage by the discharge current for respective time intervals during the discharge to compute the heat energy supplied to the discharge during each time interval, integrating means for integrating the heat energies for the time intervals during the discharge to determine the total heat energy supplied during the discharge, comparing means for comparing the total heat energy determined by the integrating means with a heat energy that produces a ball on the end of a wire having a diameter of about two to three and one-half times the diameter of the wire, and controlling means for controlling at least one of the discharge voltage, the discharge current, and duration of the discharge in accordance with the comparison and for terminating the discharge when the total heat energy reaches the predetermined heat energy.

DETAILED DESCRIPTION OF PREFERRED EMBODIMENTS

Figure 1:
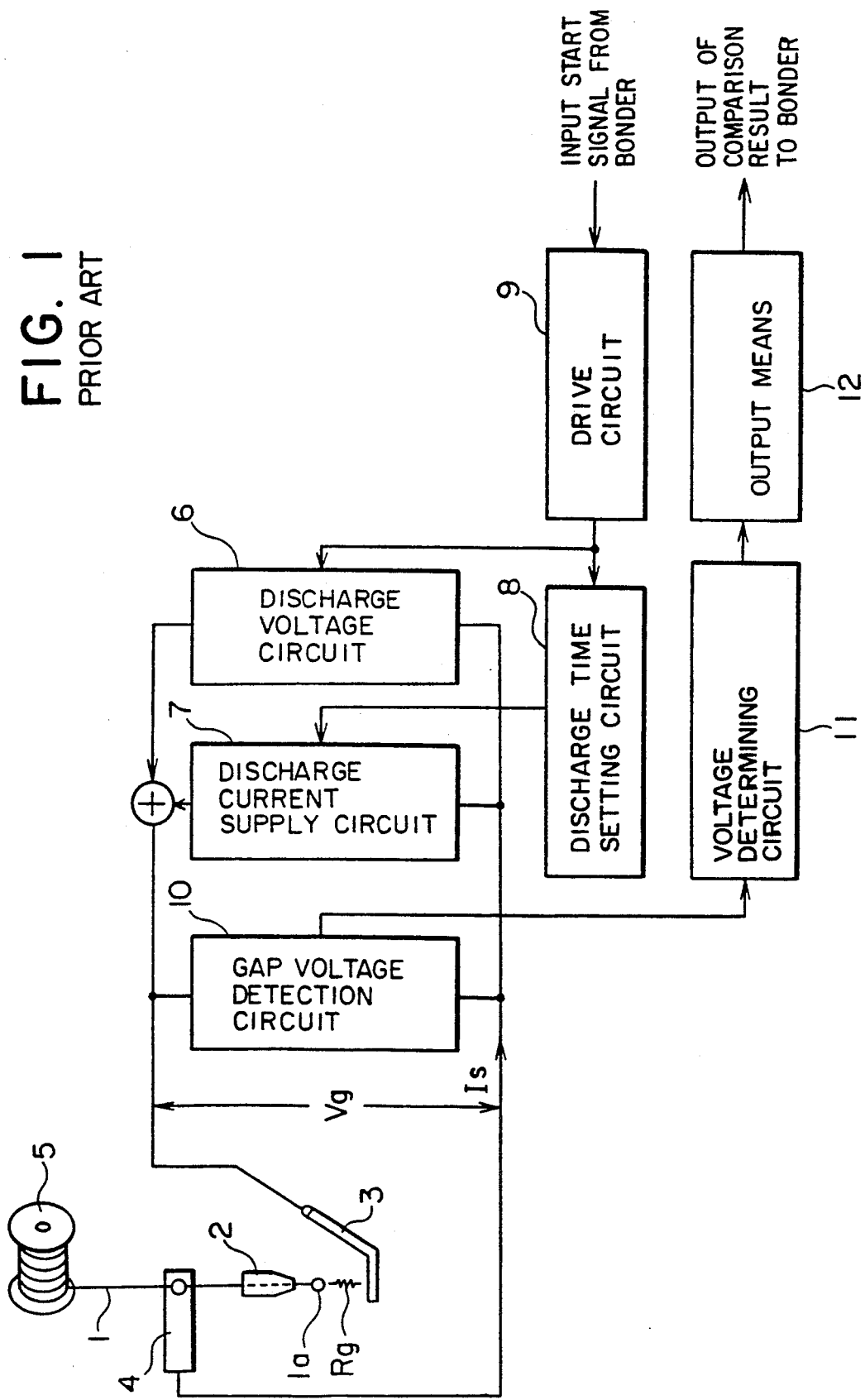
FIG. 1 is a block diagram of a prior art apparatus for forming balls on the ends of wire.
Figure 2:
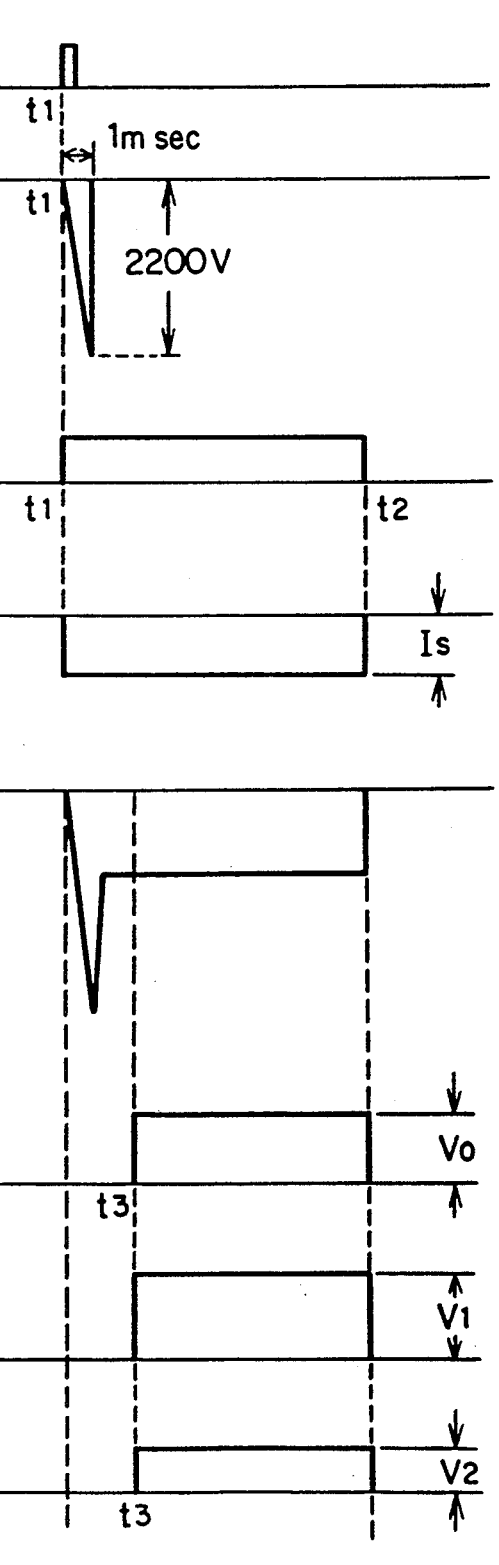
FIGS. 2(a)-2(h) comprise a time chart for explaining the operation of the apparatus shown in FIG. 1.
Figure 3:
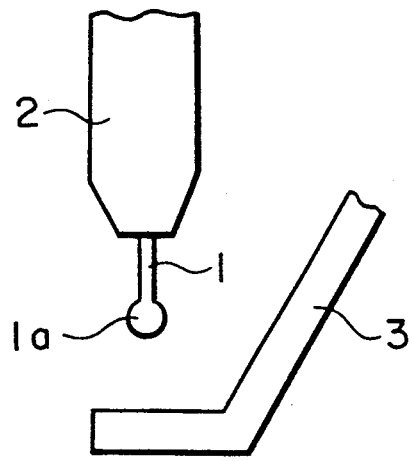
FIG. 3 is an enlarged view of the discharge portion of the apparatus shown in FIG. 1.
Figure 5:
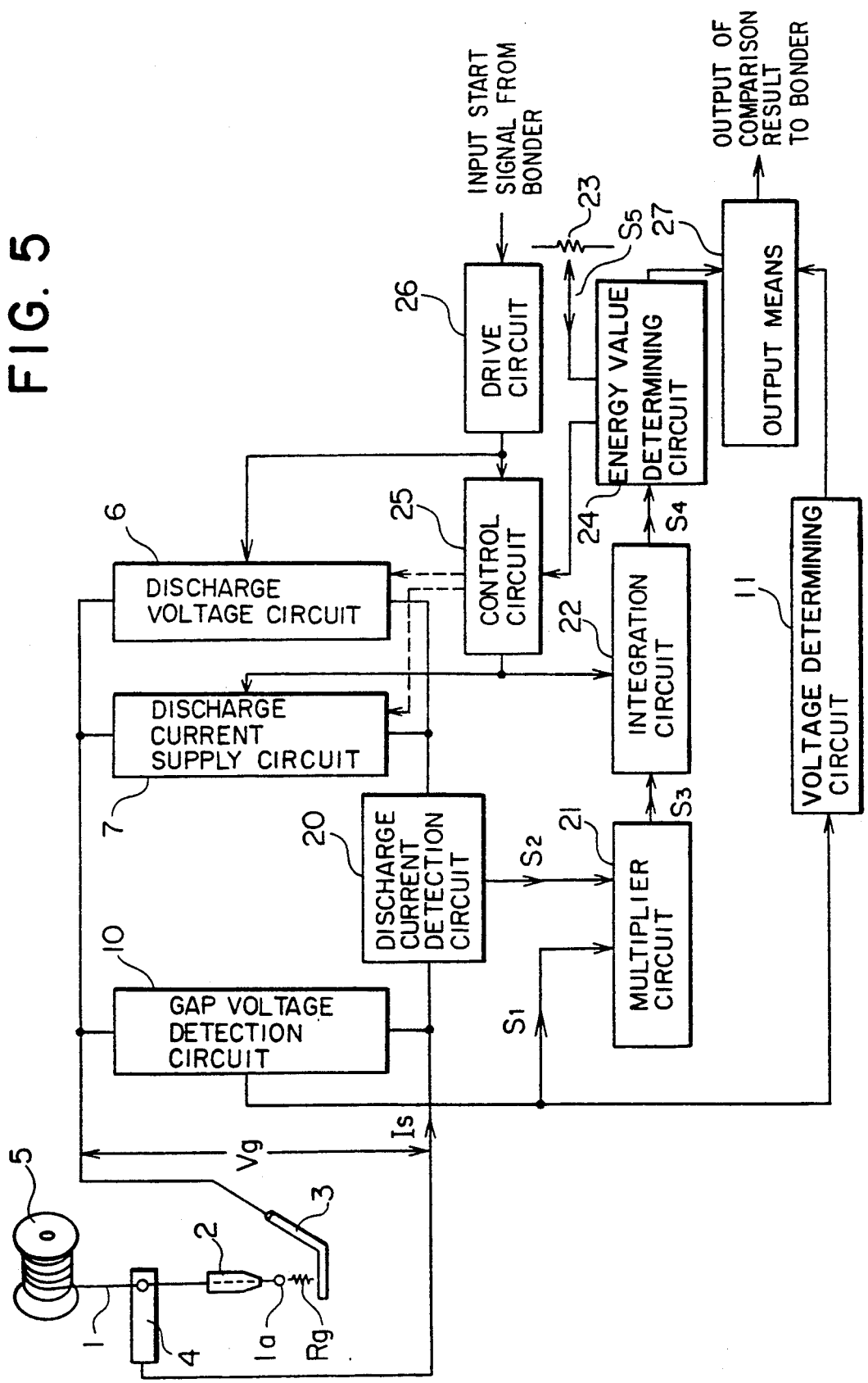
FIG. 5 is a block diagram of an apparatus in accordance with an embodiment of the present invention.

In all figures of the application, the same elements are given the same reference numbers. In FIG. 5, an apparatus for forming a ball on the end of a wire in accordance with the present invention is shown. The elements that are the same as those in the apparatus shown and described with respect to FIG. 1 function in the same manner as the elements o FIG. 1.

In the apparatus of FIG. 5, a discharge current detection circuit 20 produces a discharge current detection signal $S_2$ indicative of the magnitude of the discharge current Is flowing between the wire 1 and the electrode 3 during a discharge. As described with respect to FIG. 1, the gap voltage detection circuit 10 produces a signal $S_1$ indicative of the voltage across the gap. A multiplier circuit 21 multiples the signals $S_1$ and $S_2$ to produce an instantaneous signal $S_3$ indicative of the heat energy being dissipated in the discharge. That signal $S_3$, for sequential time periods during the arc discharge, is supplied to an integrating circuit 22 that sums, i.e., integrates, the signals $S_3$ for the respective time intervals to determine a total heat energy value as a signal $S_4$. Signal $S_4$ is delivered to a heat energy determining circuit 24 where a comparison is made between that signal and a signal $S_5$ that represents a threshold heat energy. Signals $S_4$ and $S_5$ are compared in circuit 24 and the result of the comparison is supplied to a control circuit 25. If the total heat energy supplied to the arc has reached or exceeded the threshold heat energy, then control circuit 25 terminates the arc by sending control signals to the discharge voltage circuit 6 and the discharge current supply circuit 7. At the same time, the integration circuit 22 is reset in preparation for the next discharge. An output circuit 27 receives the outputs from the voltage determining circuit 11 and the heat energy determining circuit 24 and delivers the result of a comparison of those signals to a display so that the operator of the apparatus can ensure proper operation of the apparatus.

Figure 6:
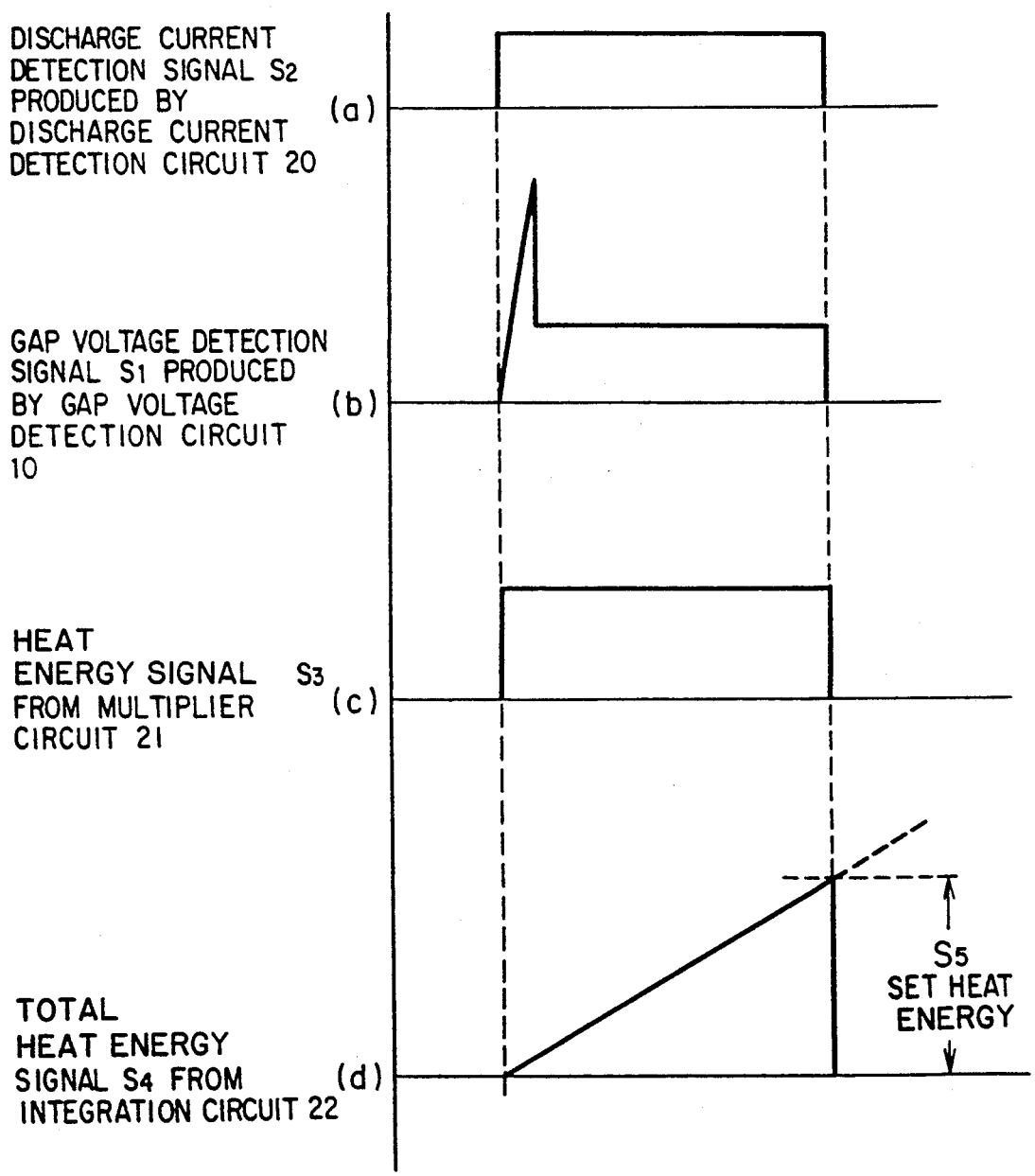
FIGS. 6(a)-6(d) comprise a timing chart for explaining the operation of the apparatus of FIG. 5.

The apparatus and the method according to the invention can be understood through the timing diagrams of FIGS. 6(a)-6(d). At the time of initiation of an arc between the wire 1 and the electrode 3, the signal $S_2$ indicative of the magnitude of the current flow increases to a substantially fixed value, as shown in FIG. 6(a). The signal $S_1$ representing the magnitude of the voltage across the gap has the waveform shown in FIG. 6(b). Initially, that voltage is quite high when the arc is initiated. Thereafter, the signal $S_1$ drops to an essentially steady value under ideal conditions. The multiplier circuit 21 computes the heat energy by multiplying the signals $S_1$ and $S_2$ to produce a signal $S_3$, shown in FIG. 6(c). Because of an inherent smoothing characteristic of the multiplier circuit 21, the initial peak voltage does not produce a significant artifact in the signal $S_3$. Signal $S_3$, which represents an instantaneous heat energy over a short period of time, is integrated in the integration circuit 22 to produce the signal $S_4$, shown in FIG. 6(d). The magnitude of the signal $S_4$ is indicative of the total heat energy supplied to the discharge in a particular ball formation operation. When the magnitude of that signal $S_4$ reaches a predetermined value $S_5$, the control circuit stops the discharge and resets the integration circuit 22. At the end of that cycle, the ball 1a has been formed on the end of the wire 1 by the combination of the heat generated at the wire in the discharge and by the surface tension of the molten metal at the end of the wire. The larger the amount of heat supplied to the wire, the larger the amount of metal at the end of the wire that is melted and the larger the diameter of the ball. Thus, to reproducibly form balls of uniform size, it is essential to control the amount of heat energy that is supplied by the discharge.

Figure 4:
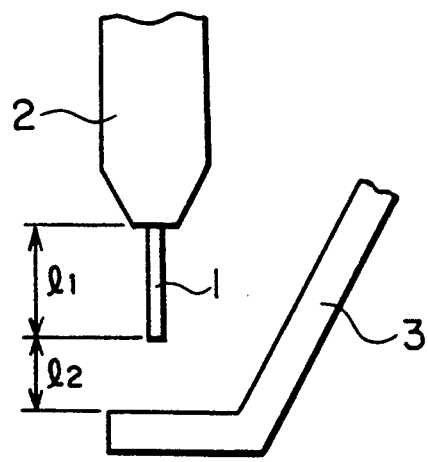
FIG. 4 is an enlarged view of the discharge portion of the apparatus shown in FIG. 1 identifying the length of a wire extending from a capillary and a gap between the wire and an electrode.
Figure 7:
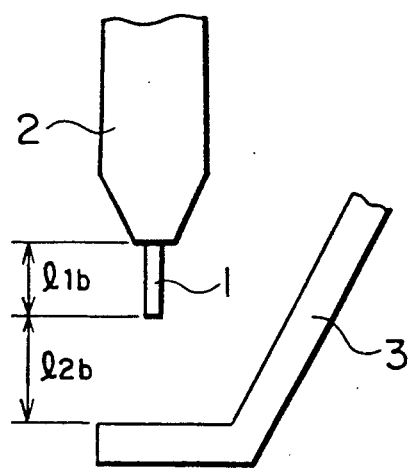
FIGS. 7 and 8 are enlarged views of the discharge portion of the apparatus of FIG. 5 illustrating variations in the operation of the apparatus.
Figure 8:
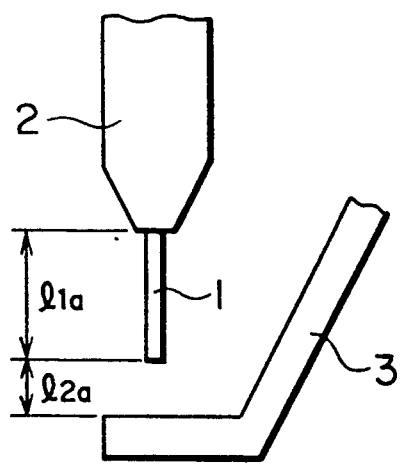

In using the apparatus and carrying out the method described, errors and variations can occur that affect the initiation and continuation of an arc discharge as well as the size of the ball formed on the end of the wire. One such variation is illustrated in FIGS. 7 and 8. In FIG. 7, the length l of the gap between the capillary 2 and the electrode 3 is divided into two parts, as shown in FIG. 4. In that example, the length of the wire, $l_{1b}$ extending from the capillary 2 is slightly shorter than desired so that the gap is larger than expected. The gap resistance Rg is increased as a result. If the discharge current Is is constant regardless of the length of the gap, then a higher than expected gap voltage Vg must be applied across the gap to initiate and sustain the discharge because of the increased gap resistance. In that situation, $S_1$ is increased so that the signal $S_4$ may reach the threshold or range of signal $S_5$ in a shorter time than expected and the discharge may be terminated earlier than expected. Conversely, when, as shown in FIG. 8, the gap length $l_{2a}$ is shorter than expected, a longer discharge time than anticipated under nominal conditions is experienced because the gap voltage Vg is reduced. Thus, according to the present invention, when the discharge current Is is maintained constant and the gap length varies, the duration of the discharge is varied to achieve uniformity in the product. As a result, a ball 1a of substantially uniform size can be repeatedly formed at the end of a wire 1.

In addition to or instead of relying upon control of the duration of the discharge to produce a uniform product, other variables can be controlled in order to produce a uniform product. The voltage of the discharge power supply or the discharge current can be controlled independently or all three factors, discharge voltage, discharge current, and the duration of a discharge, can be controlled to ensure that essentially the same heat energy is supplied in each subsequent discharge.

Figure 9:
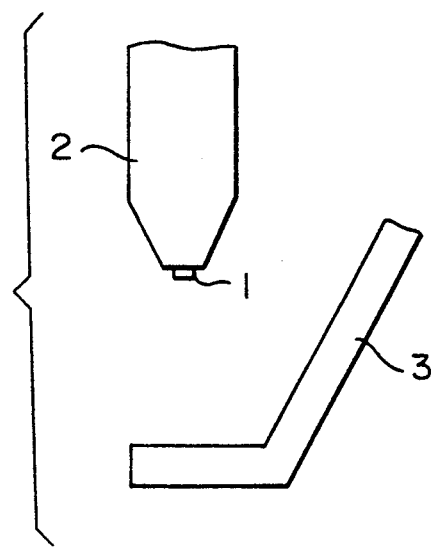
FIGS. 9 and 10 are enlarged view of the discharge portion of the apparatus of FIG. 5 illustrating variations in the operation of the apparatus.
Figure 10:
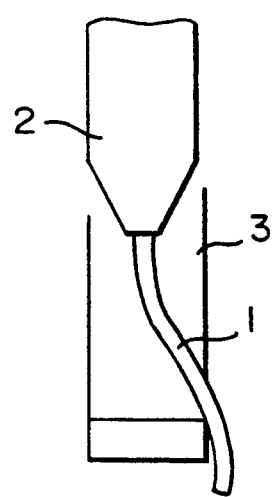

The foregoing discussion describes control of the formation of the ball 1a on the wire 1 that has been properly fed through the capillary 3 and is held by the clamp 4. However, errors in advancing the wire 1 through the capillary 2 occasionally occur and can interfere with or entirely prevent the formation of a ball at the end of the wire. When these conditions occur, it is important to alert the operator of the apparatus to take corrective action to prevent or limit failures if an attempt is made to bond a non-existent or imperfect ball to an electrode of a semiconductor chip. As illustrated in FIG. 9, in some instances the wire 1 may not be advanced significantly through the capillary 2, leaving an extraordinarily long gap between the wire and the electrode 3. In an alternative fault, the wire 1 may be advanced too far through the capillary 2 and come into direct contact with the electrode 3, as shown in FIG. 10. The end of the wire may continue to bear on the electrode 3 of may slide past the electrode 3, as shown in FIG. 10. In the latter case, there is a direct short-circuit between the wire 1 and the electrode or the gap between the wire and the electrode is far smaller than expected.

In accordance with an aspect of the invention, the undesired conditions of FIGS. 9 and 10 are detected by the voltage determining circuit 11 and cause the output means 27 to generate an alarm signal so that corrective action can be taken.

Figure 11:
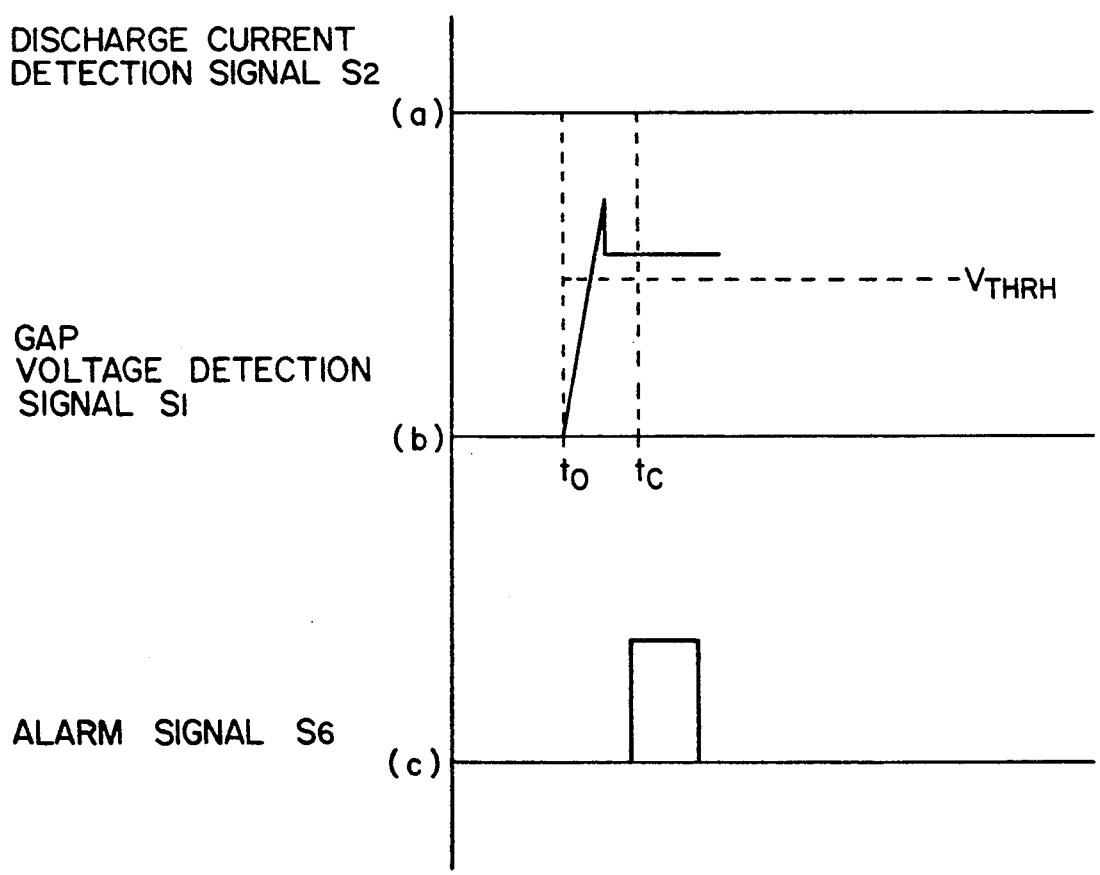
FIGS. 11(a)-11(c) and FIGS. 12(a)-12(c) are timing charts illustrating the operation of the apparatus when too little and too much wire is advanced through the capillary as respectively illustrated in FIGS. 9 and 10.

FIG. 11(a) illustrates the discharge current detection signal $S_2$ and FIG. 11(b) illustrates the gap voltage detection signal $S_1$ that are produced when the wire fails to extend from the capillary, as shown in FIG. 9. As illustrated in FIG. 11(b), at time $t_0$, a large voltage pulse for initiating an discharge, for example, 2,220 volts, is applied across the wire 1 and the electrode 3. After the application of that large pulse, a lower voltage, i.e., the sustaining voltage signal, is applied across the wire 1 and the electrode 3 by the discharge voltage circuit 6. However, because the gap is so large, either no arc is formed or the discharge is present only temporarily while the initiating voltage is present across the wire 1 and the electrode 3. Essentially no current flows so that the discharge current detection signal $S_2$ remains effectively zero, as shown in FIG. 11(a). When a discharge is established and sustained, the gap voltage detection signal $S_1$ falls to a moderate, stable level, as shown in FIG. 6(b). When a discharge is not sustained between the wire 1 and the electrode 3, as shown in FIG. 11(b), the gap voltage detection signal $S_1$ remains at a relatively high level, at or near the upper limit of the voltage signal applied by the discharge voltage circuit 6.

After a time delay of predetermined length beginning at time $t_0$, i.e., at the time $t_c$ shown in FIG. 11(b), after the discharge initiating pulse has ended, the voltage between the wire 1 and the electrode 3 is detected and compared to an upper threshold voltage, $V_{THRH}$, in the voltage determining circuit 11. In the example and apparatus described above, a typical delay time, i.e., $t_c - t_0$, is about one millisecond and a typical upper threshold voltage is about 800 volts. When the gap voltage detection signal $S_1$ exceeds the upper threshold voltage, the voltage determining circuit 11 causes the output means 27 to generate an alarm signal $S_6$, as shown in FIG. 11(c), so that appropriate corrective action can be taken.

Figure 12:
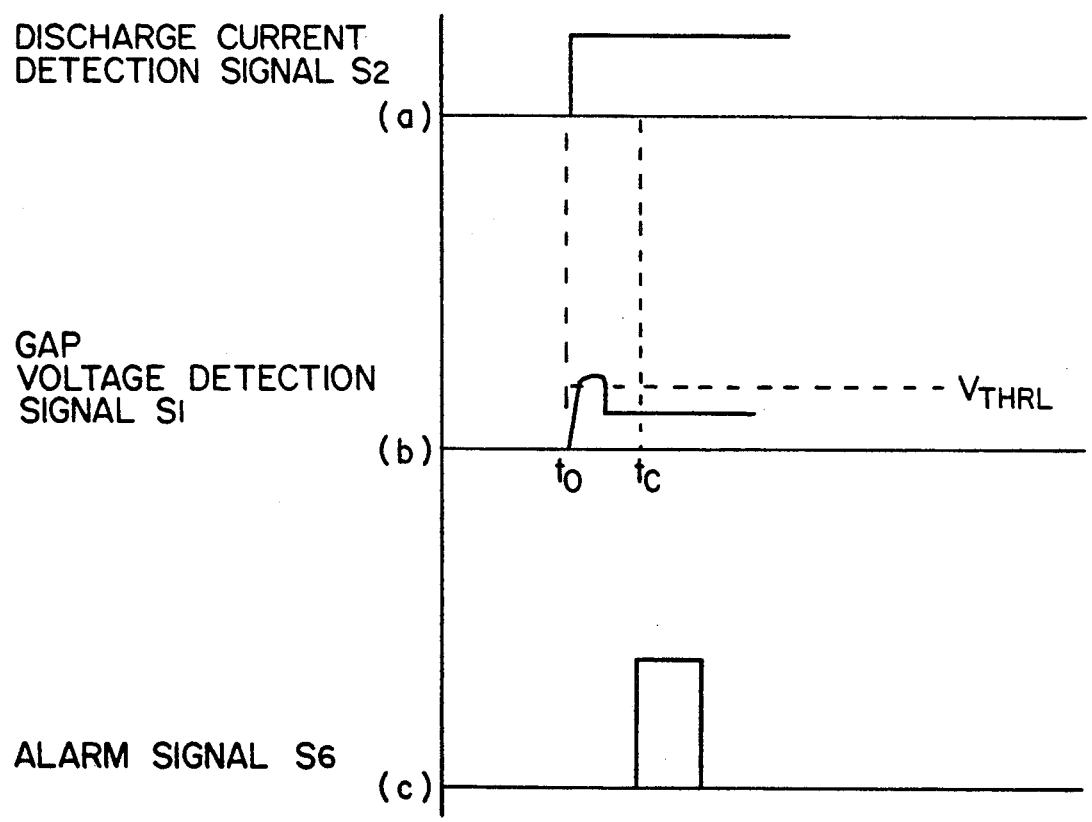

When an excessive length of wire is advanced through the capillary 2, the signals $S_1$ and $S_2$, shown in FIGS. 12(a) and 12(b), are produced. Because of the short-circuiting or near short-circuiting of the wire 1 and the electrode 3, a current flows through the wire in the electrode when the discharge initiating pulse is applied. As shown in FIG. 12(a), that current is limited by the discharge current supply circuit to a substantially constant value. That immediate, relatively heavy current flow prevents the discharge initiating pulse from reaching its full voltage and also prevents the gap voltage detection $S_1$ from reaching the moderate, stable value, e.g., 500 volts, shown in FIG. 6(b), when the voltage signal is applied after the discharge initiating pulse ends. Instead of the moderate value of FIG. 6(b), the gap voltage detection signal $S_1$ is suppressed to a relatively low value. After the time delay $t_c - t_0$, that gap voltage detection signal $S_1$ is detected and compared to a lower threshold, $V_{THRL}$, in the voltage determining circuit 11. If the signal $S_1$ falls below that threshold $V_{THRL}$, then a short-circuit or near shortcircuit is indicated and the voltage determining circuit 11 causes the alarm signal $S_6$ to be generated by the output means 27. A typical lower threshold voltage, $V_{THRL}$, is about 200 volts for the method and apparatus described here. As described for the generation of the alarm signal $S_6$ in FIG. 11(c), the generation of the same alarm signal as indicated in FIG. 12(c) is used to warn that appropriate corrective action should be taken.

In each of the described fault conditions, after the expiration of the discharge initiating pulse, the voltage signal is applied. While the voltage signal has a nominal magnitude, the gap voltage detection signal $S_1$ maintained across the wire and the electrode depends upon the size of the electrical load presented by the gap. In the condition shown in FIG. 9 where no discharge is established, the gap is essentially infinite and the voltage maintained across the wire and electrode rises to near the open circuit voltage of the discharge voltage circuit 6. When the short-circuit of FIG. 10 occurs, the load is so great, relatively to the normal discharge load of FIG. 6(b), that the voltage maintained by the discharge voltage circuit falls to a short-circuit value, well below the value expected when a discharge is present between the wire and electrode.

In employing the method and apparatus of the present invention to make connections to electrode pads of a semiconductor device, it is preferred that the diameter of the ball produced at the wire be two to three and one-half times the diameter of the wire employed. For example, a typical wire diameter employed in ball bonding of semiconductor devices is 25 microns. Therefore, the preferred diameter of a ball formed at the end of the wire is 50 microns to about 85 microns. In many instances, the diameter of the ball preferably ranges from about 60 microns to about 80 microns for a 25 micron diameter wire.

As the integration density of semiconductor circuits have increased, the amount of space available for each ball bond has decreased. Highly integrated circuits have a larger number of leads and, therefore, each electrode and associated electrical connection in those circuits must be smaller than in other circuits. Therefore, the diameter of the metal ball formed at the end of a wire is preferably at the lower end of the range of preferred diameters, for example, 50 microns or so for a wire 25 microns in diameter. The desired ball diameter information is employed to determine the amount of heat energy that is preferably expended in a discharge forming the ball. In order to reliably form a ball of the appropriate diameter, it is important that the spacing between the end of the wire 1 on which the ball 1a is formed from the electrode 3 be kept as uniform as possible. However, with such small sized wire, vibrations of the wire 1 and of the electrode 3 can result in incomplete formation of a ball. In order to produce the desired result reliably and repeatedly, it is necessary to trigger an alarm when conditions indicate that the desired ball might not have been formed.

Figure 13:
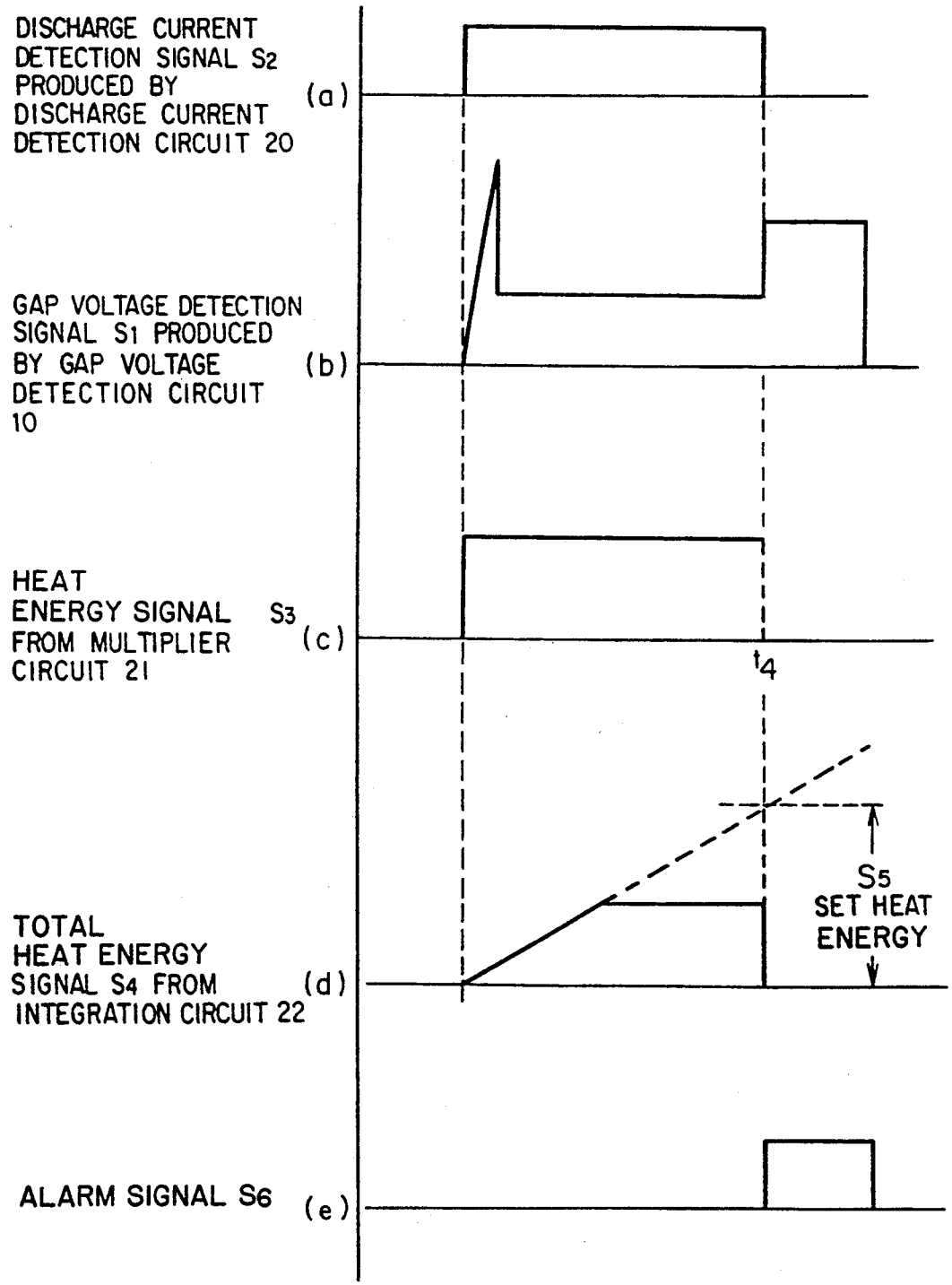
FIGS. 13(a)-13(e) comprise a timing chart illustrating operation of an embodiment of the invention.

When a ball is not properly formed, the waveforms of the signals associated with the apparatus of FIG. 5 are as illustrated in FIGS. 13(a)–13(e). FIG. 13(a) is identical to FIG. 6(a) and does not need repeated explanation. In this alternative arrangement, upon the termination of the voltage discharge, the gap voltage $S_1$ does not return to zero. Rather, as shown in FIG. 13(b), the voltage stays high in preparation for the next discharge. When, as illustrated in FIG. 13(d), the heat energy fails to reach the desired threshold because of some failure, the integration circuit 22 "times out" at time $t_4$. At that time, the total heat energy signal $S_4$ is compared to threshold heat energy. If the total heat energy has not reached that threshold, the alarm signal $S_6$ is issued by circuit 24 through output means 27 to alert the operator of the apparatus to the failure. A typical time out duration $t_4$ is, for example, 20 milliseconds measured from $t_0$, the time of initiation of the discharge between the wire 1 and the electrode 3.

The invention has been described with respect to certain preferred embodiments. Various modifications and additions will be apparent to those of skill in the relevant arts. Accordingly, the scope of the invention is limited solely by the following claims.

We claim:

1. A method of forming a ball on the end of a wire by electrical discharge between the wire and an electrode comprising:

extending in the direction of an electrode an end of a wire having a diameter;

applying a voltage pulse between the electrode and the wire for initiating an electrical discharge between the electrode and the wire;

applying a voltage signal between the electrode and the wire at the end of the pulse to sustain the electrical discharge between the electrode and the wire;

while the voltage signal is being applied, detecting and comparing the discharge voltage between the electrode and the wire to an upper threshold voltage;

generating an alarm signal if the discharge voltage between the electrode and the wire is greater than the upper threshold voltage, thereby indicating the absence of a discharge;

detecting the discharge voltage across and discharge current flowing between the wire and the electrode in the discharge;

multiplying the discharge voltage by the discharge current for respective time intervals during the discharge to compute the heat energy supplied in the discharge during each time interval;

integrating the heat energy for the time intervals during the discharge to determine the total heat energy supplied during the discharge;

comparing the total heat energy with a predetermined heat energy that produces a ball on the end of the wire, the ball having a diameter of about two to three and one-half times the diameter of the wire; and controlling at least one of the discharge voltage, current, and duration in accordance with the comparison and terminating the discharge when the total heat energy reaches the predetermined heat energy.

2. The method of claim 1 including controlling the discharge duration.

3. The method of claim 1 including controlling the discharge voltage.

4. The method of claim 1 including controlling the discharge current.

5. The method of claim 1 including measuring the time from the beginning of the electrical discharge and terminating the electrical discharge after the passage of a predetermined time interval if the total heat energy supplied to the discharge not the predetermined heat energy during the predetermined time interval.

6. The method of claim 5 including issuing an alarm if the predetermined time interval elapses without the prior termination of the electrical discharge.

7. An apparatus for forming a ball on the end of a wire by electrical discharge between the wire and an electrode comprising:
    detecting means for detecting a discharge voltage and discharge current of an electrical discharge between an end of a wire having a diameter and an electrode;
    multiplying means for multiplying the discharge voltage by the discharge current for respective time intervals during the discharge to compute the heat energy supplied in the discharge during each time interval;
    integrating means for integrating the heat energies for the time intervals during a discharge to determine the total heat energy supplied to the discharge;
    comparing means for comparing the total heat energy with a predetermined heat energy for producing a ball on the end of the wire, the ball having a diameter of about two to three and one-half times the diameter of the wire; and
    controlling means for controlling at least one of the discharge voltage, current, and duration in accordance with the comparison and for terminating the discharge when the total heat energy reaches the predetermined heat energy, said integrating means including means for measuring the time from the initiation of the flow of the discharge current and for actuating said controlling means to terminate the electrical discharge after passage of a predetermined time interval from the initiation of the flow of the discharge current if the total heat energy has not reached the predetermined heat energy.

8. The apparatus of claim 7 including a voltage determining means for determining whether the discharge voltage is higher than a predetermined voltage.

9. The apparatus of claim 7 wherein said controlling means controls the discharge voltage.

10. The apparatus of claim 7 wherein said controlling means controls the discharge current.

11. The apparatus of claim 7 including alarm means for indicating termination of the discharge current after the passage of the predetermined time interval.

12. A method of forming a ball on the end of a wire by electrical discharge between the wire and an electrode comprising:
    extending in the direction of an electrode an end of a wire having a diameter;
    applying a voltage pulse between the electrode and the wire for initiating an electrical discharge between the electrode and the wire;
    applying a voltage signal between the electrode and the wire at the end of the pulse to sustain the discharge between the electrode and the wire;
    while the voltage signal is being applied, detecting and comparing the discharge voltage between the electrode and the wire to a lower threshold voltage;
    generating an alarm signal if the discharge voltage between the electrode and the wire is less than the lower threshold voltage, thereby indicating the absence of a discharge;
    detecting the discharge voltage across and discharge current flowing between the wire and the electrode in the discharge;
    multiplying the discharge voltage by the discharge current for respective time intervals during the discharge to compute the heat energy supplied in the discharge during each time interval;
    integrating the heat energy for the time intervals during the discharge to determine the total heat energy supplied during the discharge;
    comparing the total heat energy with a predetermined heat energy that produces a ball on the end of the wire, the ball having a diameter of about two to three and one-half times the diameter of the wire; and
    controlling at least one of the discharge voltage, current, and duration in accordance with the comparison and terminating the discharge when the total heat energy reaches the predetermined heat energy.

13. The method of claim 12 including controlling the discharge duration.

14. The method of claim 12 including controlling the discharge voltage.

15. The method of claim 12 including controlling the discharge current.

16. The method of claim 12 including measuring the time from the beginning of the electrical discharge and terminating the electrical discharge after the passage of a predetermined time interval if the total heat energy supplied to the discharge has not reach the predetermined heat energy during the predetermined time interval.

17. The method of claim 16 including issuing an alarm if the predetermined time interval elapses without the prior termination of the electrical discharge.

* * * * *